United States Patent
Biebuyck et al.

[11] Patent Number: 5,925,259
[45] Date of Patent: Jul. 20, 1999

[54] LITHOGRAPHIC SURFACE OR THIN LAYER MODIFICATION

[75] Inventors: Hans Andre Biebuyck, Thalwil; Bruno Michel, Gattikon, both of Switzerland

[73] Assignee: International Business Machines Corporation, Armonk, N.Y.

[21] Appl. No.: 08/690,956

[22] Filed: Aug. 1, 1996

[30] Foreign Application Priority Data

Aug. 4, 1995 [WO] WIPO .................. PCT/IB95/00610

[51] Int. Cl.⁶ .................................................. H01L 21/00
[52] U.S. Cl. .................. 216/2; 216/10; 216/11; 216/17; 216/41; 216/53; 216/56; 216/92; 438/748
[58] Field of Search ................ 216/2, 10, 11, 216/17, 41, 53, 56, 92; 438/748; 156/345 L

[56] References Cited

U.S. PATENT DOCUMENTS

| | | | |
|---|---|---|---|
| 2,897,066 | 7/1959 | Graham et al. | 156/7 |
| 3,647,508 | 3/1972 | Gorrell | 216/87 |
| 3,716,911 | 2/1973 | Burtscher et al. | 438/133 |
| 4,021,279 | 5/1977 | Hirs | 156/654 |
| 5,512,131 | 4/1996 | Kumar et al. | 156/655.1 |
| 5,725,788 | 3/1998 | Maracas et al. | 216/41 |
| 5,772,905 | 6/1998 | Chou | 216/44 |

OTHER PUBLICATIONS

Kumar et al., "Features of gold having micrometer to centimeter dimensions can be formed through a combination of stamping with an elastomeric stamp and an alkanethiol "ink" followed by chemical etching", pp. 2002–2004, Appl. Phys. Lett. 63 (1993).

J. L. Wilbur et al., "Lithographic Molding: A Convenient Route to Structures with Sub–Micrometer Dimensions", Advanced Materials, (1995), 7, No. 7, pp. 649–652.

*Primary Examiner*—Richard Bueker
*Attorney, Agent, or Firm*—Robert M. Trepp

[57] ABSTRACT

A process for producing lithographic features in a substrate layer is is described, comprising the steps of lowering a stamp (15) carrying an reactant (14) onto a substrate (10), confining the subsequent reaction to the desired pattern, lifting said stamp and removing the debris of the reaction from the substrate. Preferably, the stamp carries the pattern to be etched or depressions corresponding to such a pattern. Using the described methods, patterns with submicron features can be generated. The method allows a general solution to parallel handling and transfer of materials in a variety of technical fields.

9 Claims, 8 Drawing Sheets

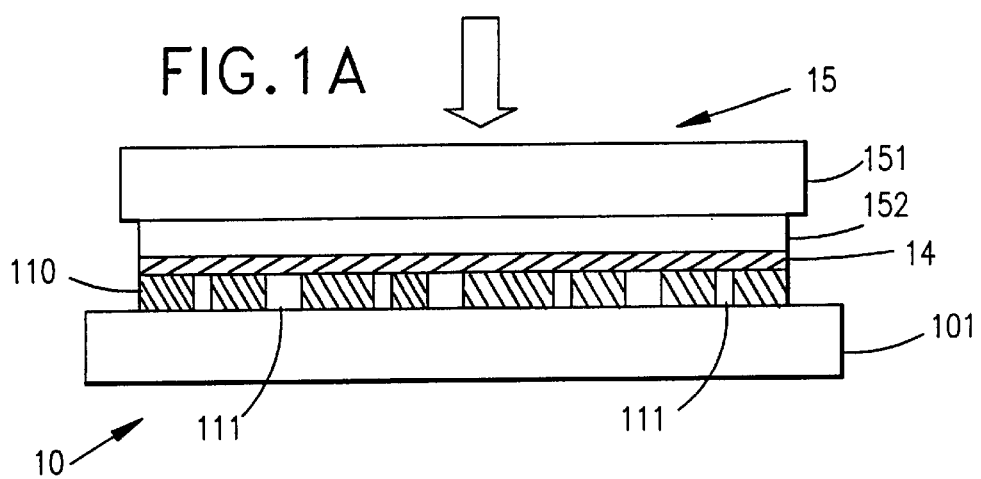
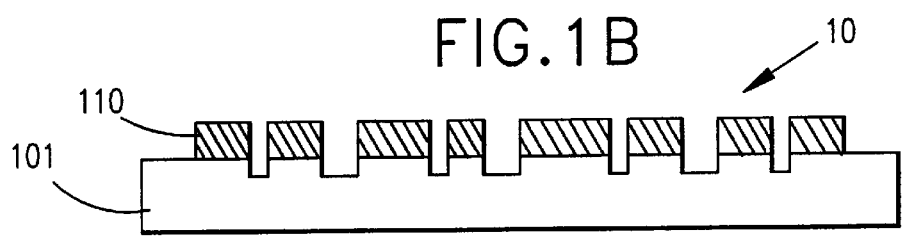
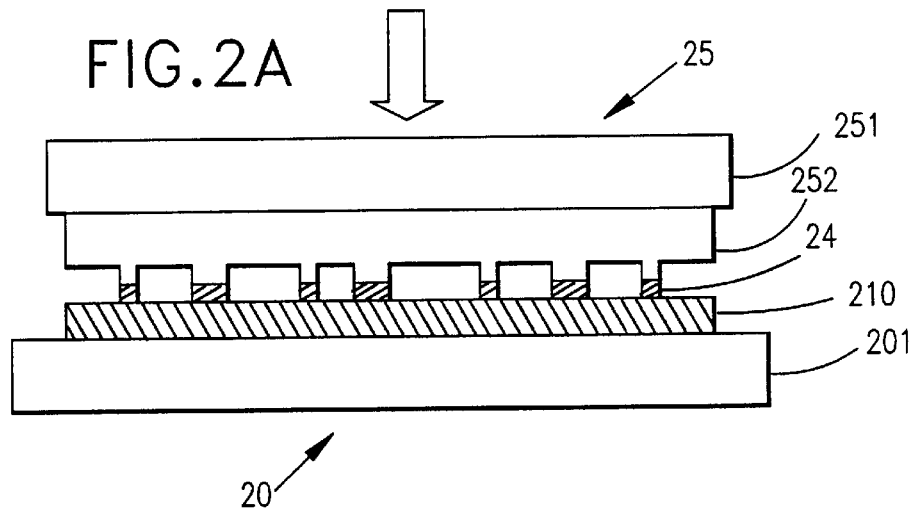
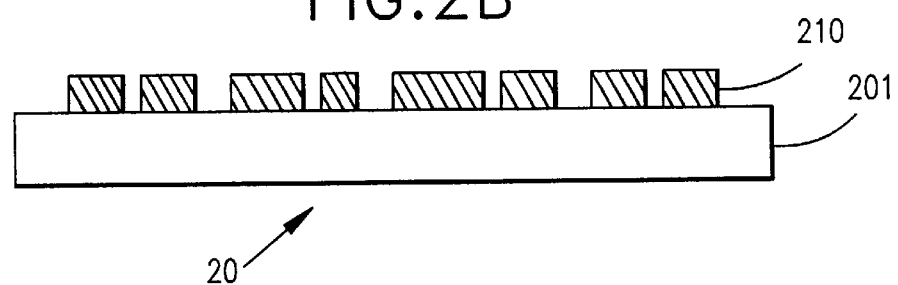

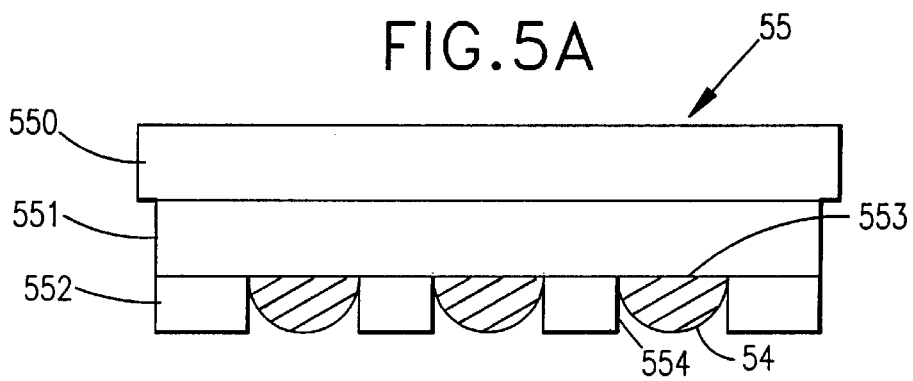
FIG.5A
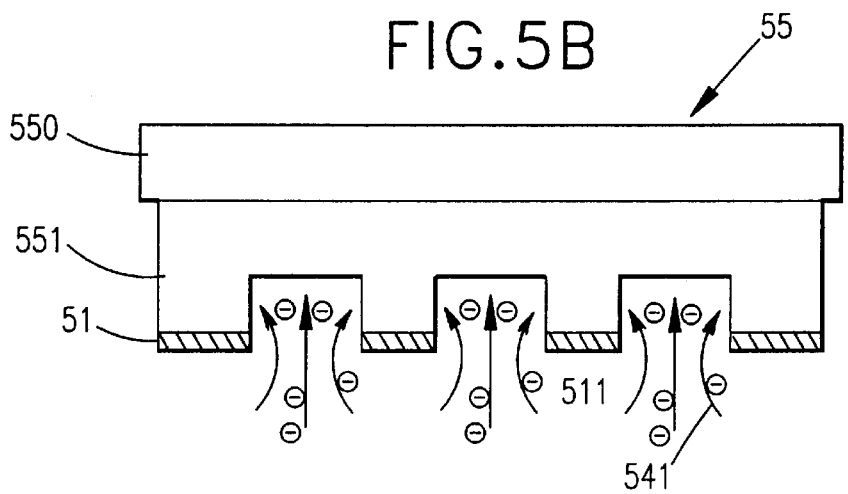
FIG.5B
FIG.5C
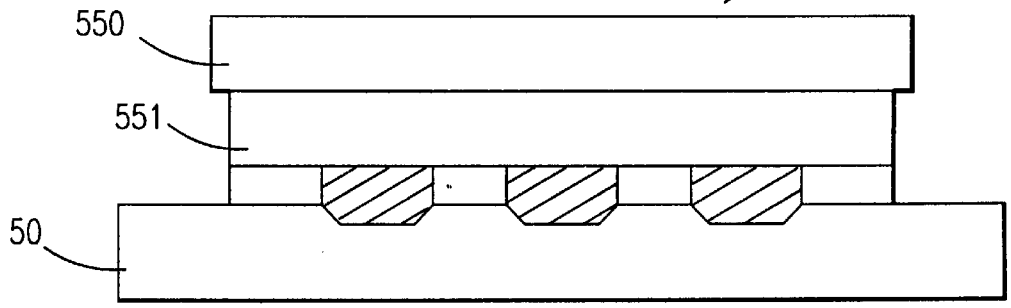
FIG.5D

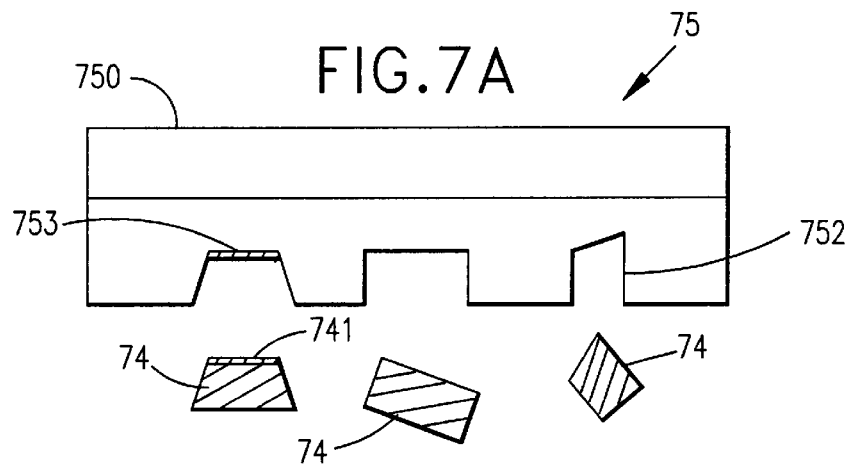
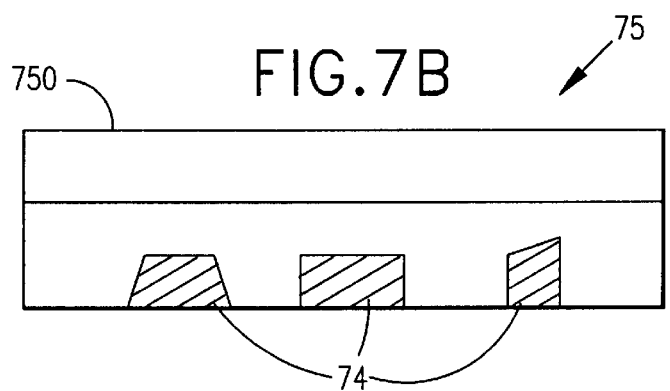
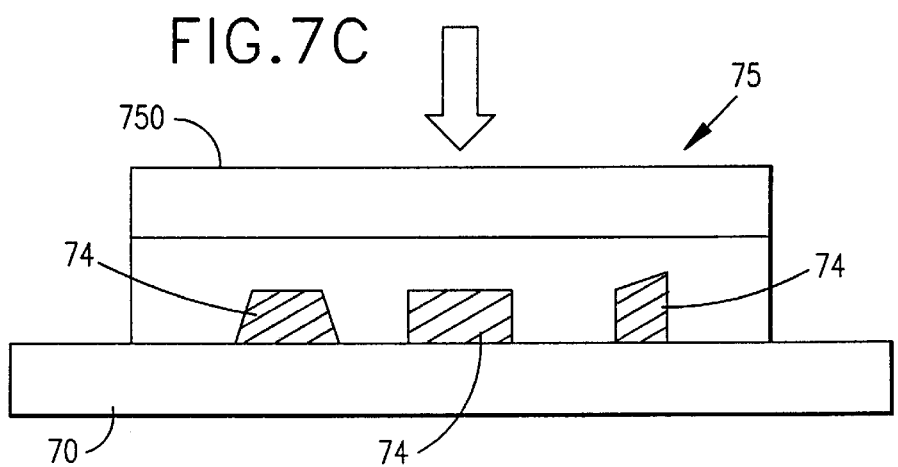
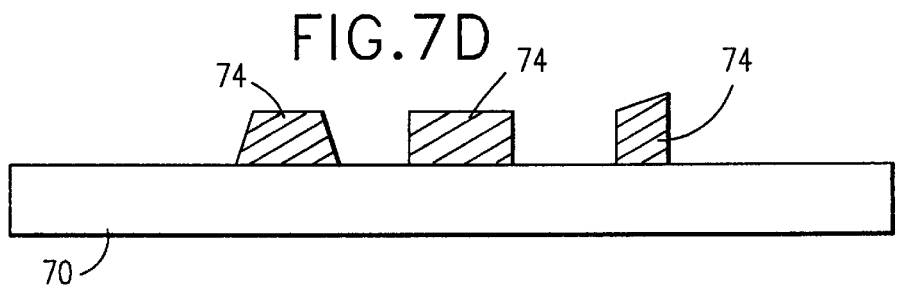

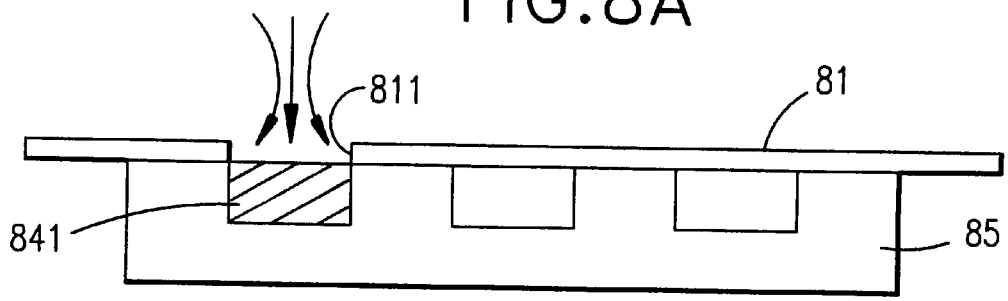
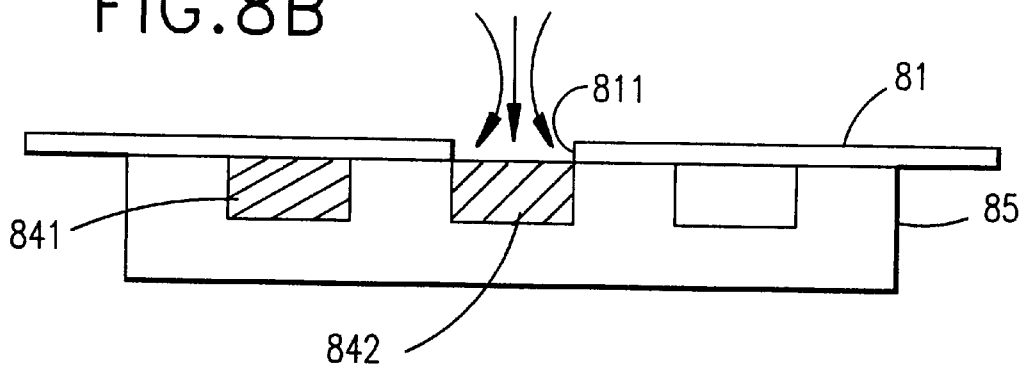
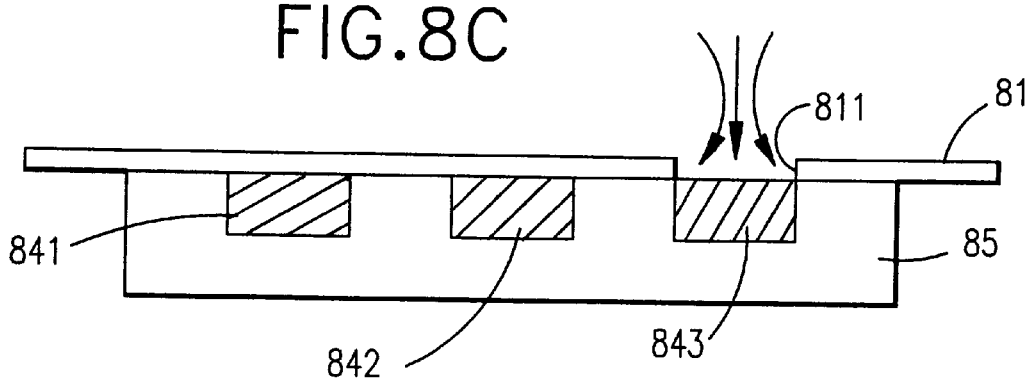

LITHOGRAPHIC SURFACE OR THIN LAYER MODIFICATION

The present invention is directed generally toward a lithographic process, involving the modification of the surface of a substrate at precisely determined areas, thus creating a lithographic pattern on the substrate. It relates particularly to producing structured layers for use in the manufacturing of electric and electronic devices, such as integrated circuits, displays, storage media, sensors, and the like. More specifically, the invention relates to an etching step within such a lithographic process.

BACKGROUND OF THE INVENTION

Though the current invention is also applicable to lithographic processes as used in printing industry, the current invention is mainly concerned with lithography as applied in the production of electronic and electric devices, sensors, and the like. The characteristic length scale, i.e. the design rule of the relevant lithographic pattern is usually in the micron to submicron region. The manufacturing process of these devices is currently almost entirely dominated by methods based on optical or e-beam lithography.

Since the emergence of integrated circuits (ICs) and micromechanical devices, optical lithography has been crucial for the purpose of their mass production: Its convenience, parallel operation and resolution has created a huge market. Fabrication of devices with ever smaller dimensions, necessary to satisfy the demands of storage and computation, becomes increasingly problematic with visible light as processes steadily reach fundamental limits, predominantly set by diffraction. This realization triggered intense research in UV, X-ray, e-beam, and Scanning Probe (SP) lithography. These methods deliver high resolution with varying success and their economics remain, at best, uncertain. Reasons for these uncertainties include limitations due to wavelength dependent phenomena, the slow writing speeds of e-beam and SP lithographies, and challenges in finding appropriate resists and masks.

A separate and related limitation of current lithographies is the complexity of processes required for modifying or altering a layer at regions defined by the desired lithographic pattern to be written; lithography today relies on bulk transfer of reactive material from the liquid or gas phase, or from a plasma using masks to protect the other regions of the substrate.

An alternative approach to lithography has been published by A. Kumar and G. M. Whitesides in : Appl. Phys. Lett. 1993, 63, 2002–2004. In this process, known as microcontact stamp lithography, stamps are fabricated by casting a replica in poly(dimethylsiloxane) (PDMS) of a master with a negative of the desired pattern. In the one known example of microcontact stamping used for lithography, the PDMS stamp is inked with an alkanethiol, hexadecanethiol, and transferred to gold by transient contact between the stamp and the gold substrate. The thiol covalently binds to the gold in an autophobic reaction: the thiol modifies the wettability of the gold substrate, preventing spread of the bulk liquid phase and thus confining the transferred monolayer to the region of contact between the raised regions of the elastomeric stamp and the substrate. The presence of these thiols allows subsequent lithographic processing of the gold using a cyanide/oxygen etch that selectively removes gold not protected by a monolayer of alkanethiol. Although this system allows reproductions of features in gold down to one micron, its scope remains limited to a special subset of useful materials, i.e. thiols and gold.

In all these lithographic processes, a number of agents are used which pose a considerable potential threat to the environment. Huge efforts are therefore taken to sufficiently protect workers within IC factories and the population living in their surrounding from a possible exposure to these agents. Immense resources are also invested for safely depositing the waste and remains of the IC manufacturing.

The object of the present invention is to avoid limitations in the type of reactions, materials transferred and range of substrates useful in contact based lithography and to demonstrate new strategies of direct processing of substrates without the intervening application of resists.

It is a further object of the inventions to improve the known lithographic processes by providing a method for modifying a surface at precisely determined positions. While being more convenient to apply, the new process should at least have a resolution comparable to state-of-the-art lithography. Another object of the invention is to restrict the amount of agents and material used in the lithographic process, in particular, hazardous waste generated by this process should be minimized.

As mentioned above, lithographic processes are also found in the field of printing. In particular, color printing is found to face similar problems concerning alignment during several separated printing steps as encountered in lithography for semiconductor devices. In four color printing the colors cyan, magenta, yellow and black are applied to four separate printing rollers that transfer the lithographic pattern to the paper in four separate printing steps. The alignment among those four printing steps limits the maximal resolution and quality of color images especially on cheap and low quality paper. Printing can either be done with poor alignment ($\sim$0.1 mm) and bad image quality on cheap paper or with better alignment ($\sim$0.01 mm) and better image quality on high quality paper. The rastering dimension has to be adapted to the alignment and consequently is >0.1 mm (<300 dpi) for low quality paper and>0.01 mm (<3000 dpi) for the paper with the highest quality. Photographic reproduction, on the other hand, can be carried out with grain sizes of the order of microns (<0.001 mm). Thus, high quality printing requires expensive equipment able to maintain tolerances of 10 microns over several meters.

It is therefore seen as another object of the invention to improve the conventional color printing procedure, in particular to facilitate the alignment procedure necessary to print several colors.

SUMMARY OF THE INVENTION

The object of the invention is achieved by a method and a stamp as set forth in the appended claims.

Herein the term substrate is used as a synonym for the layer of material to be altered or transformed by the lithographic process. The term reaction is meant to include chemical reactions, etching or dissolving reactions, as well as modification by physical processes such as diffusion. A deformable or an elastic layer is preferably defined as a layer having a Young's modulus in the range $10^4$, more preferably $0.25*10^6$ to $5*10^6$ dyne/cm$^2$. Suitable materials having this property could be poly(butyidiene), poly(dimethylsiloxane), poly- (acrylamide), poly(butylstyrene) and co- or block-polymers, thereof. A conformal contact between two surfaces accommodates the unevenness of both surfaces. In addition to the elastic layer, the stamp may comprise a support structure and/or layers of rigid material. A stamp according to the present invention should not be restricted to a basically flat form. It may take on other shapes, such as rollers or half-spheres.

A process according to the present invention transforms the substrate material by either a chemical reaction, such as etching, or by the diffusion of a dopant. The substrate or layer to be modified is thus not exposed to an atmosphere, plasma or immersed into a bulk solution containing the reacting substance or dopant. The present invention is characterized in that the reactive substance or dopant is transferred to the surface of the substrate by contact printing with the soaked or wetted stamp.

The reaction can be confined to a desired lithographic pattern by several methods:

In a first variant of the invention, the stamp has, within the desired range of accuracy, a flat surface and, thus, makes contact with the substrate along its entire supporting surface. The stamp confines the reactant strictly to the interface between stamp and substrate. No reactant is released into the surrounding. A pattern-wise reaction is achieved by either patterning the substrate in a previous lithographic step such that only the pattern area is affected by the subsequently applied reactant, or by using a mask which covers a part of the substrate from the stamp, exposing only the other, unprotected part to the reactant.

Within the interface layer itself, at regions of the substrate not protected from the reactant by the previous lithographic step or the mask, a reaction commences. At other regions of the substrate, which are either inert or protected, transfer of the reactant from the stamp to the substrate stops after a very short period. In case that the mask is etched away by the reaction, care has to be taken to choose its thickness such that the reactant does not contact the substrate at the protected areas within the exposure time. The unprotected areas of the substrate are immediately exposed to the reactant through the holes in the mask.

The new reaction process is controlled by a proper selection of the stamp material, of the participant in the reaction to be applied to the stamp, and of the resist material or mask. The process is further controlled by the amount of reactant provided to the reaction zone by the stamp, the pressure exerted on the stamp, the contact time, and the temperature at the interface between stamp and substrate. By adjustment of these parameters, it is for example possible to adapt the penetration depth of an etching reaction to the thickness of the layer to be etched. In particular, use can be made of self-passivation occurring when the first molecular layers of the substrate react with the reactant as provided by the stamp, forming a protective layer for the substrate material beneath. As the thickness of this passivation layer is dominated by diffusion, the reaction process can be very conveniently controlled by the temperature. Also, autophobic reactions may be used to confine the reaction zone. The new process is favorably applied when the layers to be modified are thin, e.g. below 100 nm.

In another preferred embodiment of the invention, the reaction is confined to the lithographic pattern by patterning the surface of the stamp such that it reproduces the desired pattern on the surface of the substrate. The features of the pattern on the stamp are formed as protrusions, soaked or wetted with the reactant. It is an advantage of this embodiment of the invention that no mask or protective coating is required to produce a desired pattern on the substrate. The reactant is confined to those regions of the substrate which are to be modified; thus reducing the applied amount of the reactive agent. A pattern can be written to the stamp by any known lithographic process, including e-beam lithography, UV-VIS lithography, and lithography employing a scanning probe microscope (SPM lithography), by the method described in Kumar et al., or by using the stamp lithographic process as described herein. Another advantage of this embodiment of the invention is that materials, in particular organic materials such as being used for thin film displays, can be modified directly without having to apply a photoresist coating.

The reactive agent preferably is an etchant used to etch the desired features into the substrate. In yet another preferred embodiment, the patterned surface of the stamp carries a catalyst, thus confining the reaction zone to the immediate vicinity of areas in which the catalyst is present.

A further preferred embodiment of the invention utilizes a new approach to pattern transfer using conformal contact between surfaces: While in the previous embodiments, the surface of the stamp carries the reactant, in present embodiment of the invention ideally the surface is free from the reacting substance, and instead microcontainers, such as wells, trenches, depressions, or recesses, are filled with the reactant. These microcontainers can be formed as replicas of lithographically formed masters that contain a negative image of the desired microcontainers, in a pattern of arbitrary complexity and with individual volumes set by the sizes of protrusions in the masters. These microcontainers, preferentially formed from an elastomer, hold an etchant, reactant, or a material for subsequent parallel chemical processing. The substance in these containers is preferably held in place using differential wetting between the interior and exterior of the containers, e.g., a substance is confined to the inside of the container by rendering its interior hydrophilic and the surrounding surface areas hydrophobic.

When an array of elastomeric microcontainers is brought into contact with a surface, the areas of the elastomer between the reliefs that form the microcontainers come into molecular contact with the substrate as described by Chaudhury and Whitesides (Science 1992, Vol. 255, 1230–1232). This molecular, or conformal, contact, provides a tight seal between the microcontainer and the substrate so that the contents of the microcontainer attack the substrate only through the openings of the microcontainers. Confinement of the processing step occurs as a consequence of the molecular seal between the elastomer and substrate and not by autophobic reaction as described in Kumar et al., so a wide range of reactants and processing strategies are possible on a variety of substrates that includes, but is not limited to, gold, aluminum, silicon, strontium titanate, plastics, or glass. Direct processing using microcontainers does not require a resist layer so that this form of lithography is simpler than contact lithography based on the known stamping or other conventional lithographies based on light or electron beams. Since the microcontainers rely on contact, the wavelength of light is not a limitation in achieving ultimate resolution with this technique. Because the volume of each microcontainer in the array is independent of the others, i.e., the amount of material transferred locally to the substrate is constrained to the size of the microcontainer allowing processing to occur to different extents in adjacent regions. Thus microcontainers allow convenient three dimensional processing of substrates in applications where heterogeneous topologies are required. Since the contents of microcontainers are independent of each other, a subset of microcontainers in an array can hold one type of agent whereas other subsets of the containers hold a different agent. This type of differential filling of the microcontainers is readily achieved using patterned elastomeric lids with openings keyed to the underlying microcontainers. The pattern in these lids allows selective access to the microcontainers so that they are filled differentially using a series of patterned lids. Thus the contents of microcontainers with different agents, or combinations of agents, are simultaneously transferred to the substrate in a single processing step.

Hence, in this embodiment of the invention recesses or depressions in the surface of the stamp are used as microcontainers for storing the participant in the reaction, while the the surface does not carry any agent. It is seen as a major advantage of this embodiment of the invention that the reaction zone is inherently sealed by those protruding parts of the surface of the stamp when the stamp is pressed onto the surface of the substrate. The method has the potential of delivering an improved resolution compared to the known methods and the above-mentioned embodiments. The use of this embodiment of the invention is not limited to surface modification but can well be applied for depositing material onto the substrate. By use of a selective filling procedure, such as adapting the shape and/or by modifying the properties of the the faces of the microcontainers, or by using a mask or lid to cover selected containers, as described above, different materials can be brought in contact with the substrate simultaneously. Besides accelerating. a lithographic process, this embodiment can also be applied for simultaneously preparing, screening or testing of a large number of samples, such as drugs or new compounds for superconducting devices. In addition, it was found that the selective filling of microcontainers in an elastomeric stamp can also advantageously be used in conventional color printing.

It is further contemplated to use the herein described method for transferring an dopant to the surface of the substrate. By heating the interface between the stamp and the substrate, the dopant diffuses into the bulk material of the substrates. As this method requires a heat-resistive matrix or stamp material. Heating of the stamp however can by a avoided by transferring a very high concentration of the doping agent, which diffuses at low temperatures into the substrate material. Then the stamp is removed and the substrate is heated such that the dopants diffuse deeper into the bulk material of the substrate.

These and other novel features believed characteristic of the invention are set forth in the appended claims. The invention itself however, as well a preferred mode of use, and further objects and advantageous thereof, will best be understood by reference to the following detailed description of illustrative embodiments when read in conjunction with the accompanying drawings.

DESCRIPTION OF THE DRAWINGS

The invention is described in detail below with reference to the following drawings:

FIGS. 1A and 1B illustrate schematically an etching process in accordance with a first embodiment of the invention.

FIGS. 2A and 2B illustrate schematically an etching process in accordance with a second embodiment of the invention.

FIGS. 5A–5B illustrate schematically an etching process in accordance with a variant of the fourth embodiment of the invention.

FIGS. 7A–7D illustrate schematically a process in accordance with a variant of the fourth embodiment using microcontainers for a selective deposition on a substrate.

FIGS. 8A–8C illustrate schematically another process in accordance with a variant of the fourth embodiment using microcontainers for a selective deposition on a substrate.

MODE(S) FOR CARRYING OUT THE INVENTION

Figure 3A:
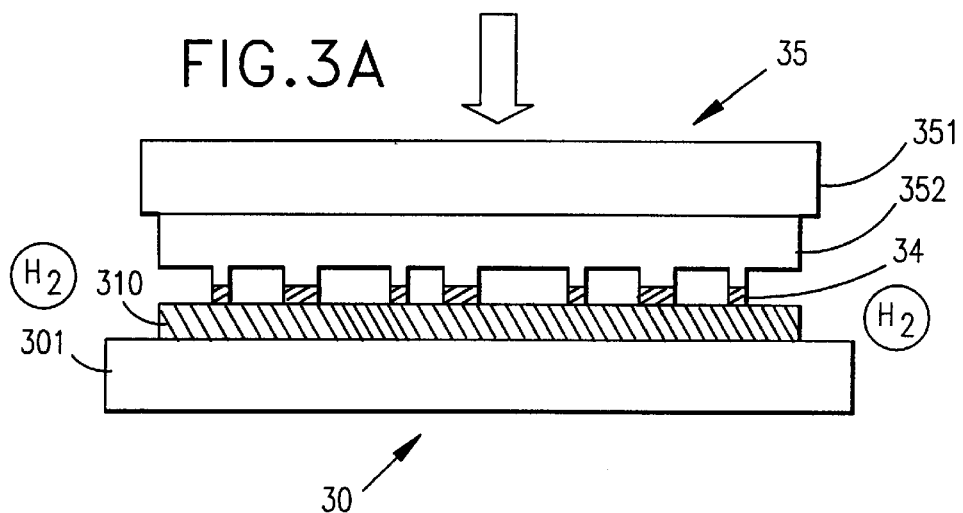
FIGS. 3A and 3B illustrate schematically a catalytic reaction in accordance with a third embodiment of the invention.

Referring to FIGS. 1A and 1B, a first example in accordance with the invention is shown, in which a protective layer of hexadecanethiol 110 is transferred to a base layer 101 of gold using a patterned stamp inked with the hexadecanethiol solution in ethanol. Details of this procedure are described in the above cited prior art. Subsequently, another stamp 15 with an essentially flat contact area is wetted with mixture of cyanide (CN) and potassium hydroxide (KOH) 14. This agent is brought in contact with the protective coating 110 by lowering the stamp 15 onto the substrate 10. The stamp comprises a solid base plate 151 and a layer of the elastic polymer poly(dimethylsiloxane) (PDMS) 152, which accommodates the unevenness of the substrate. The PDMS layer 152 is wetted with the etchant 14 after being made hydrophilic by its brief contact with an acid or reactive plasma. In contact with the coating 110, the etching process starts at the unprotected regions 111 while the rest of the coating remains, at least to a large extent, inert against the etchant 14. When the etching process is terminated, the stamp 15 is lifted and the substrate is rinsed with water to remove the debris. The substrate after the rinsing is shown in FIG. 1B. The gold layer 101 is removed with a speed of approximately 10 nm/min at the unprotected areas. A considerably smaller amount of etchant is released into the environment by this process than by all known etching processes.

Figure 3B:
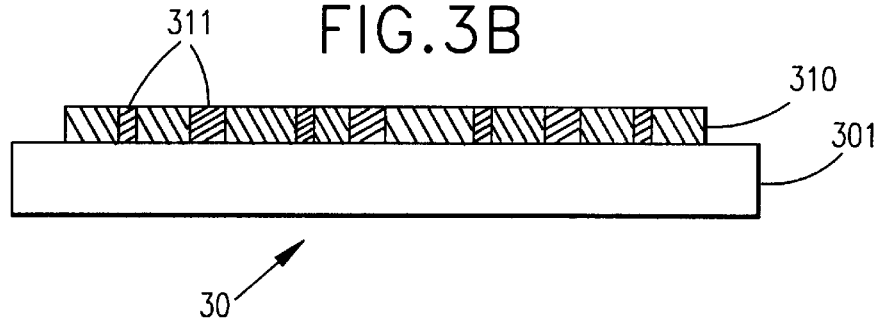

Another example of an etching process in accordance with the invention is illustrated by FIG. 2A. In this example, no patterned coating or mask is required as the pattern is transferred along with the etchant 24 by a stamp 25 with a patterned surface layer 252 onto the substrate 20. The patterned layer 252 is fabricated as a replica of a patterned photoresist layer. A PDMS elastomer is cured on top of this photoresist layer, and then adhered to a suitable substrate 251 and peeled off the photoresist. Using this method, submicron lithographic pattern can be reproduced. The pattern of the stamp 35 is wetted carefully with mixture of nitric acid ($HNO_3$) and hydrochloric acid (HCI) 24. A lesser amount of etchant than in the previous example is required to wet or soak the protruding pattern features. For etching the stamp is brought into close contact with a gold covered silicon substrate 30. After etching a pattern of gold 210 is left on the surface of the silicon 201, as is shown in FIG. 2B A patterned stamp is also used in the example illustrated by FIGS. 3A and 3B. In this example of the invention, the pattern is covered by a layer of platinum 34. The silicon substrate 301 is covered by an azido-terminated self-assembled monolayer (16-azidohexadecanethiol, HS—$(CH_2)_{16}$—$N_3$) 310. The platinum covered stamp 35 is brought into contact with the silicon substrate 30 in a solution of isopropanol saturated by hydrogen. Transient contact between the protrusions covered by platinum catalyst 34 and the substrate causes a conversion of the azido functional group to an amine only where the platinum makes direct contact with the surface 311. Because this catalytic reaction occurs on all parts of the patterned surface simultaneously, one second is sufficient to ensure effective conversion on an arbitrarily large area 311. For comparison, the method of Muller et al., published in Science 268 (1995), 272–273, to produce lithographic pattern of amino-terminated thiols, which is inherently sequential and relies on STM control to position the metal catalyst, requires 126 minutes to convert a 100 $mm^2$ area.

Figure 4A:
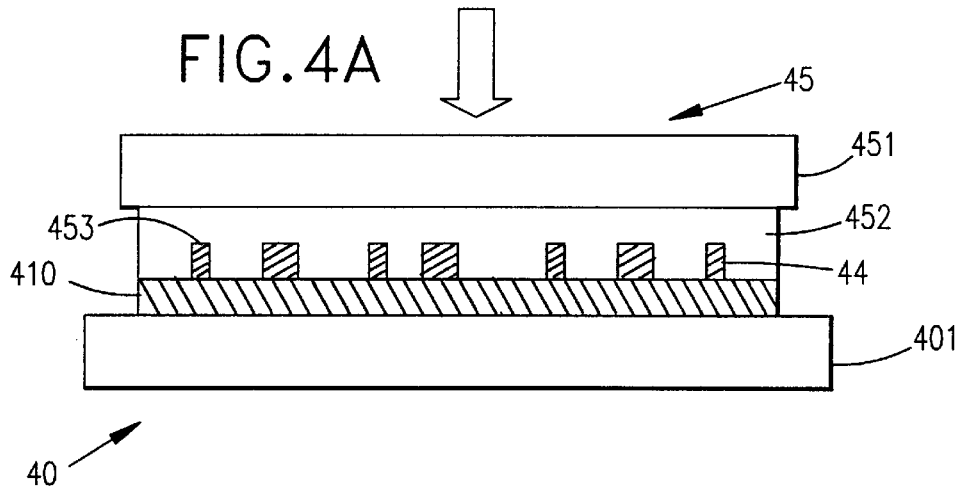
FIGS. 4A and 4B illustrate schematically an etching process in accordance with a fourth embodiment of the invention using microcontainers.
Figure 4B:
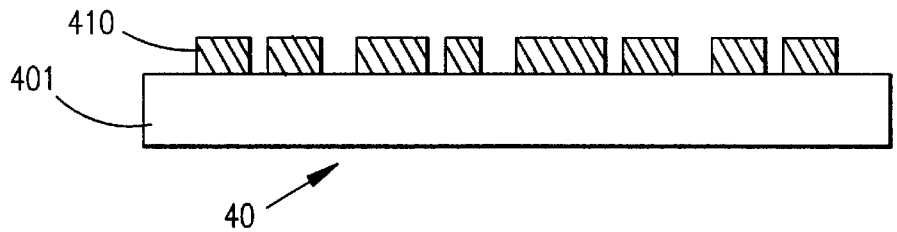

An alternative method to control the application of direct chemical reaction is to fill the reactants 44 into microcontainers 453, as is depicted in FIGS. 4A and 4B. These microcontainers are wells, trenches, recesses or depressions of the surface 452 of the stamp 45. The reactant solution does not contaminate the surface of the stamp but is deposited into the wells or trenches patterned into the surface of the stamp. The microcontainers 453 preferably have at least one dimension, i.e. length, width, or depth, in the submicron region. Embedded in the elastic matrix 452 of the stamp, it is possible to bring all microcontainers simultaneously into contact with the surface of the substrate. A particularly convenient way to fill these microcontainers is by self-assembly of the liquid into these containers based on the differential wettability of the surface: a microcontainer for example may comprises a hydrophilic base and/or sidewalls while the surrounding surface of the stamp is hydrophobic. A liquid will thus be held by capillary forces in the hydrophilic regions and be easily removed from the hydrophobic regions by, for example, shear forces.

These containers can preferentially be realized using a composite stamp structure as shown in FIG. 5A. The composite stamp comprises two layers of material, wherein the first layer 551, forming the base of the microcontainer 553, is hydrophilic and the second layer 552, forming the sidewalls of the microcontainer 554 and the surface of the stamp, is hydrophobic. An aqueous solution 54 wets the surface as shown in FIG. 5A.

In a further embodiment of this variant of the invention, the wetting properties of the preformed microcontainers are directly controlled by exposing them through a mask 51 to a vapor or plasma 541 of a reactive species that changes the chemical characteristic of the exposed region (FIG. 5B). The mask provides openings 511 for the direct passage of this vapor or plasma, or alternatively allows selective passage of light that activates the surface or a reactive gas, which in turn is used to modify the surface. The mask 51 is made preferentially from an elastomer with the appropriate openings that makes conformal contact with the underlying stamp, thus establishing a leakproof seal.

The property of an elastic layer to form a leakproof seal when pressed onto another surface is also exploited when the stamp 55 with the microcontainers is brought into contact with a substrate 50. The surface of the stamp acts as mask and protects the surface where conformal contact is made, sealing it from the contents 54 of the microcontainers. Moderate vertical forces on the stamp bring the surface of the liquid film into patterned contact with the substrate and trigger the start of the process (FIG. 5C). If the filling of the microcontainers consists for example of an etching agent, the substrate is left with depressions in the exposed regions (FIG. 5D).

In a similar manner, electrochemical processes could be carried out when layer 551 is either an ionic or metallic conductor. A convenient way of preparing patterned electrodes is to form a thin patterned layer of elastomer on top of a metal, conductive polymer or ionic gel. The thin layer of elastomer again provides conformal contact and thus a leakproof seal between the bottom electrode and the substrate, simultaneously electrically insulating these regions.

Figure 6A:
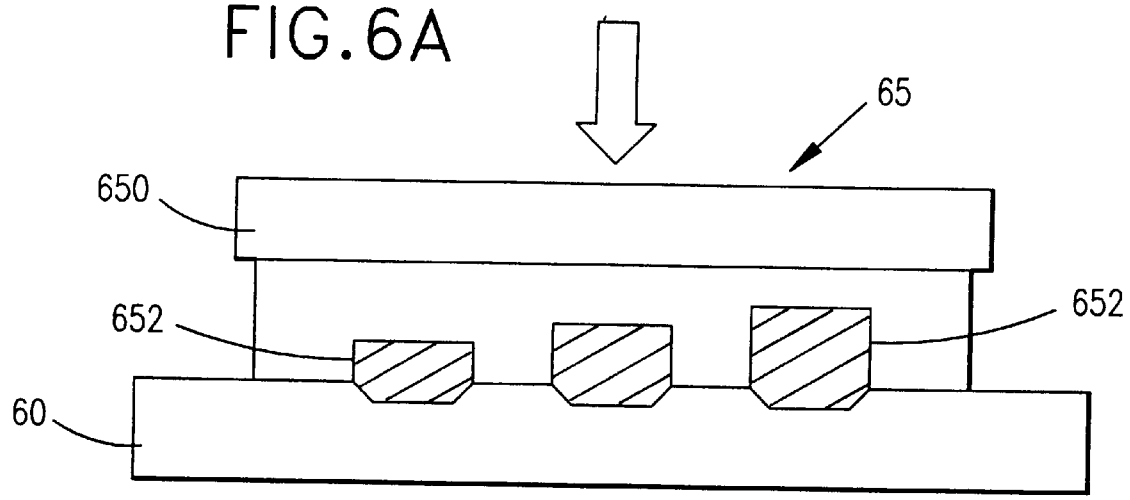
FIGS. 6A and 6B illustrate schematically an etching process in accordance with a variant of the fourth embodiment using microcontainers with different depths.
Figure 6B:
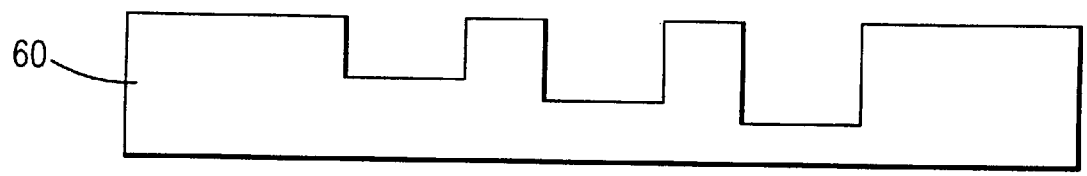

The penetration depth of the etchant, or in general the impact of any surface reaction induced by this method, can further be controlled by the filling volume of the microcontainers. This type of control leads to a stamp design where the trenches 652 are formed with varying filling level or with varying depth, as illustrated by FIG. 6A. The new process provides a method for the formation of truly three dimensional topography or profiles in a substrate 60 using a single lithographic processing step (FIG. 6B).

Another example of this formation of 3D structure is a chemical or an electrochemical reaction that deposits a solid material on top of the substrate. The volume of reactant in the microcontainer and the shape of the microcontainer can both be used to determine the shape of the resulting features.

In addition to building or removing structures on the substrate, the new contact process can be used to modify the material properties like wettability, or dopant concentration or chemical identity in the exposed regions of a substrate, as the type of reaction depends only on the participants in the reaction, i.e., for a given substrate on the filling of the recesses or microcontainers. In addition to processes involving liquids, these novel containers for chemical reactions are also applicable to processes involving gas, gels, and solids on a wide variety of substrate types. The volume of the containers provide strict and flexible control over the extent and type of reactions. The shape of the containers controls the patterned transfer.

It is further contemplated to use microcontainers for a discriminant self-assembly of preformed solid parts 74 for subsequent transfer to the substrate 70, as schematically illustrated by FIGS. 7A–7D. Shape recognition of these solids could further be-refined by a selective modification of the walls 752 and bottom 753 of the microcontainers. For example, a hydrophilic/hydrophobic face 741 on the solid would enhance preorientation of this solid with a similar matching hydrophilic/hydrophobic face 753 in a microcontainer. Further refinement would result from the use of specific ligand-receptor complexes. Complementary strands of DNA provide a particularly robust example of this type of ligand-receptor interaction used as a "glue" to attach a preformed solid in an oriented manner in a microcontainer. The solids 74, themselves, could be molded within the microcontainer by deposition or reaction processes prior to their transfer to the substrate 70 (FIGS. 7C,D).

The description to this point has focused on homogeneous reactions carried out within the volume of unique microcontainers. It is however further possible to carry out simultaneously different reactions by selective filling of these microcontainers. This selective filling can be achieved by placing patterned "lids" 81 on top of the array of microcontainers, as shown by FIG. 8A–8C. The openings 811 in these patterned lids allow selective passage of gas, liquids or solids into a subset of the microcontainers. By controlling the size of the openings, the flux of material into different microcontainers is controlled in a single processing step. Changing the patterned lid 81 allows access to an alternative subset of microcontainers (FIGS. 8B, 8C), resulting in a differential filling of the total array.

In the example of FIGS. 8A–8C, each three adjacent microcontainers of an array are filled with different substances 841–843 respectively. These could for example be phosphors with different light emission. The contents of the containers can be further processed or transferred directly to the substrate. An additional masking step could provide a differential set of electrical contacts by transfer of a plating solution or evaporation from a effusive source. As the lids and the pattern can be produced with a resolution of below 1 micron, this methods can be used, for example, for manufacturing of high-definition flat panels.

The selective filling of microcontainers in an elastomeric stamp can also be applied to conventional color printing. Instead of four separate print masters which carry the colors cyan, magenta, and yellow, together with black, only one print master with microcontainers is required when using a selective filling process as described above.

Figure 9:
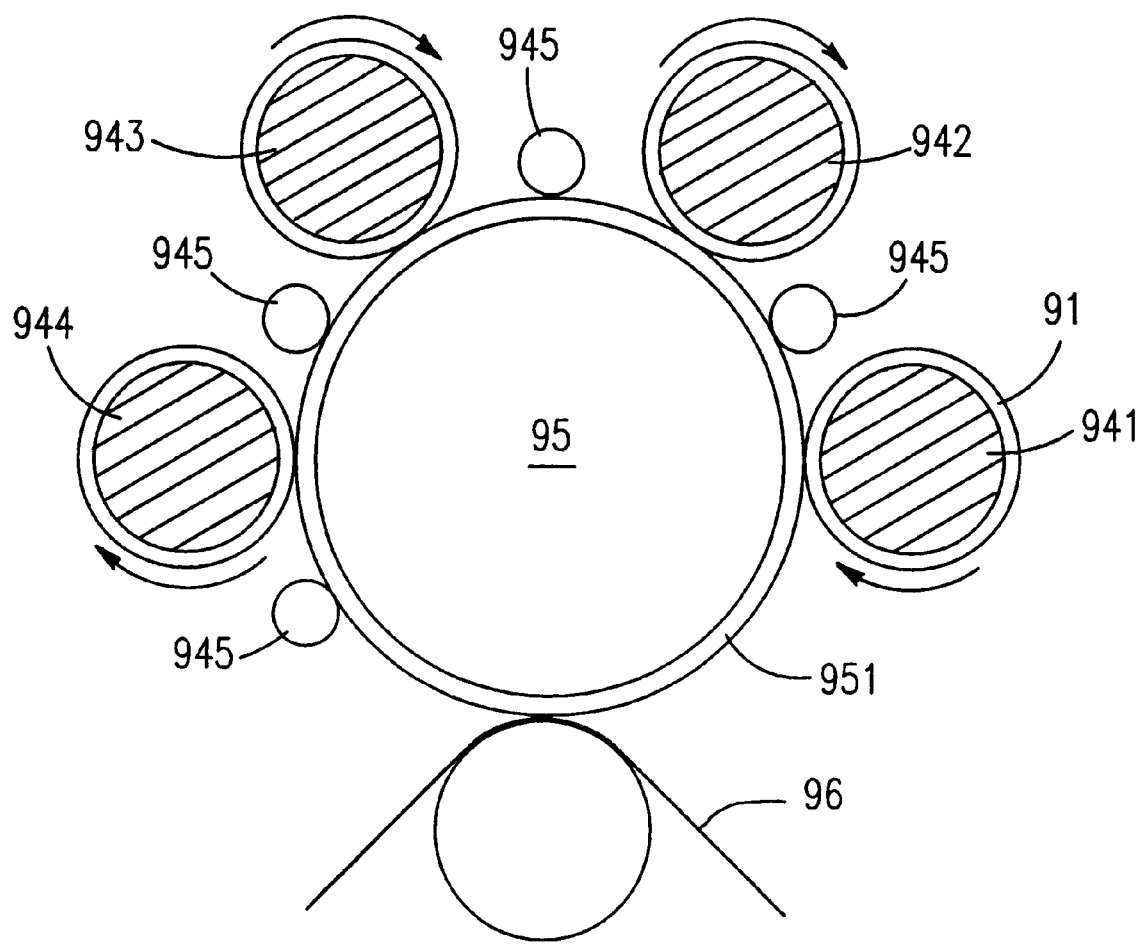
FIGS. 9 and 10A–10F illustrate schematically the use of a process in accordance with a variant of the fourth embodiment using microcontainers for a selective deposition on paper for color printing.

The schematic setup for a printing process is illustrated by FIGS. 9 and 10. The printing master roller 95, which carries an elastic layer 951 with microcontainers, is surrounded by four color rollers 941–944 having half of the diameter of the master roller and four cleaning rollers 945. Each color roller transfers one of the colors cyan, magenta, yellow and black to the printing roller 95 through a lid layer 91 The lid layer has openings only to those microcontainers of the printing roller, which are to be filled with the respective color. The cleaning rollers 945 wipe the surface of the printing roller. After the loading of the microcontainers, their contents is transferred to the paper 96.

The color printing is hence performed in one step largely eliminating the need for alignment, except for the one between the master and the four lid rollers. For this alignment, the use of self- or inherent alignment means are possible, such as mutually corresponding protrusions and recesses on both types of rollers.

Figure 10A:
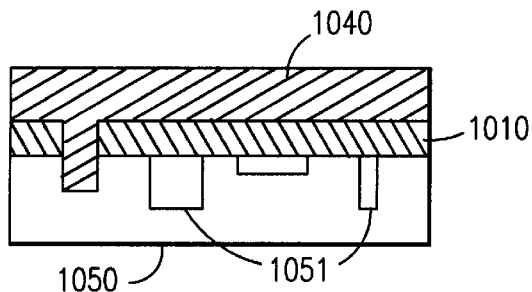
Figure 10B:
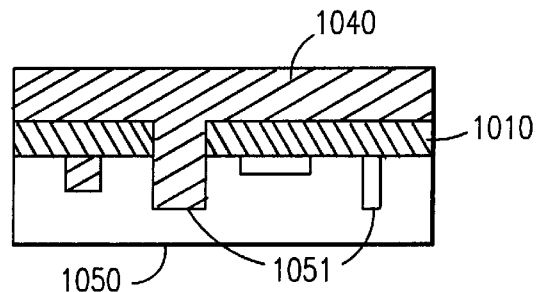
Figure 10C:
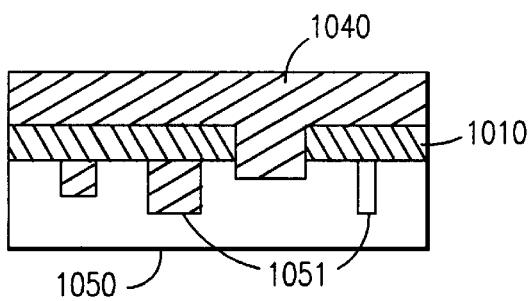
Figure 10D:
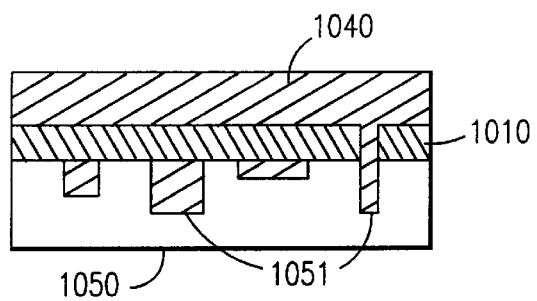
Figure 10E:
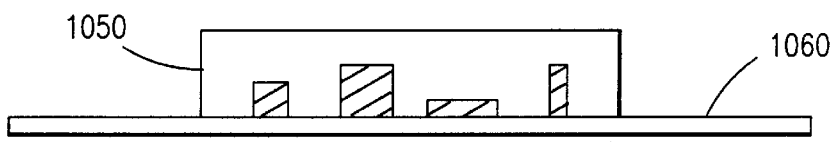
Figure 10F:
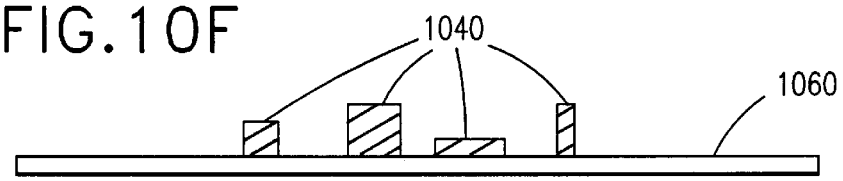

The filling and printing procedure is further illustrated by FIGS. 10A–F. The figures show the plane which includes the center axis of the printing roller 95 and the center axis of each of the four color rollers 941–944, respectively, along the respective contact line between both rollers. For each color (including black) 1040, the lid layer 1010 of a color roller opens the passage to the respective microcontainers 1051 in the printing master layer 1050. The microcontainers of FIG. 10 have a different shape to distinguish the different colors. FIGS. 10E and 10F illustrate the color transfer to the band of paper 1060.

In a variant of this embodiment, a color mixing is achieved with lids on different color drums which provide access to the same set of microcontainers such that the mixing occurs within each of these containers before their contents is transferred to the paper.

The maximal contrast of printed images can be enhanced since the amount of transferred color can not only be determined by the diameter of the microcontainers but also by their depths. A typical contrast for a microcontainer diameter ratio of 1:8 is 512 instead of 64. The sizes of the microcontainers can vary between 0.3 micron, given by the self-alignment and 3 micron. This results in a resolution of 8500 dpi and a contrast of 1:1000, well in the range of color photography. The requirements concerning tolerances and accuracy of such equipment are stricter than those for conventional instrumentation, but are limited to one set of printing roller with four ink rollers.

Since contact lithography as being the main concern of the present invention allows reduction of most of the process in semiconductor fabrication to printing-like steps, the stamp may take the shape of a printing roller contacting wafers attached to a transport medium. Especially applications where the coarse alignment accuracy before self-alignment does not need to be better than 10 microns, like printing of flat panel polymer LED displays could be handled by this process analogously to the printing of paper as described above.

Another example demonstrating the usefulness of the concept of microcontainers as described herein is found in the field of preparing and screening of liquid and solid materials, e.g. therapeutic agents. Single agents with known efficacy often have increased effectiveness (lower toxicity) when used in conjunction with other agents of a similar or different class of compounds. With the selective or differential filling, a wide range of such combinations can be prepared enabling an effective search for optimum mixtures. This search is carried out directly in the volume of the microcontainer by homogenousfy adding a solution of the target to all microcontainers and carrying out an assay. For the preparation or screening of a combinatorial array, a series of lids is required, which cover different regions of the stamp surface. Such a set of lids may cover half, a quarter, an eighth, and so forth, of the microcontainers.

By varying for example the amount and composition of precursors for a superconducting compound in each microcontainer using said series of lids, the resulting solids (from sintering or another reaction) would have a stoichiometry that reflects the original starting concentrations of the precursors. Since important material properties of these bulk solids are known to be tremendously influenced by composition (superconductivity, elastic modulus, reflectivity, crystallinity, etc.), this method provides a practical way to synthesize "libraries" of compounds with systematic variation of single parameters. In further process steps, these samples, each being the content of one microcontainer, can be transferred as a pattern to a substrate by pressing this substrate to the surface of the microcontainer stamp. By contacting each compound with metallic contacts, batch measurements of the critical temperature and other parameters of a superconductor can be performed.

Compared to known processes in which the different reactions have to be performed sequentially, the possibility of carrying out several reactions simultaneously provides an inherent alignment of the simultaneous processes and reduces the necessary equipment. The presence of microcontainers also allows combinatorial syntheses with good separation to neighboring microcontainers. The reduced number of processes carried out on the final surface reduces the amount of processing time and susceptibility to contamination.

In the following, an example combining several of the above described alternatives and embodiments of the present invention is presented. A microcontainer plate is formed with an array of regular circular depressions 300 nm deep and 10 micrometer in diameter by pouring a prepolymer of polydimethylsiloxane (PDMS) onto a silicon master with the negative of these features and curing the polymer. In parallel, a second silicon substrate is prepared that has a patterned set of openings keyed to the array of circular depressions. These openings transit the entire thickness of this silicon wafer, which is 10 micrometer, forming a perforated silicon lid. This silicon lid is a single crystal protected by a thermal oxide of two nanometer thickness, which is maintained as a hydrophilic surface by rinsing with acid.

The PDMS microcontainer plate, supported on a glass substrate, is aligned to the openings in the previously described silicon lid using a three axis mechanical aligner. On alignment the supported PDMS microcontainer plate is allowed to contact the silicon lid under its own weight so that a releasable adhesive interaction occurs between the elastomeric plate and the lid. This assembly is turned over and placed within a chamber for exposure to an rf water plasma (10–2 mbar $H_2O$/Ar) for 15 minutes, thus rendering the interiors of the microcontainers hydrophilic but not the regions between these containers which are masked by the silicon lid.

The assembly is removed from the chamber and a drop of 10% buffered HF placed directly on top of the openings in the silicon lid. The containers are filled by capillary action; brief (10 sec) treatment with ultrasound (sonication) ensures consistent filling. The lid is removed by fixing the glass support that holds the microcontainer plate in an aligner and gently lifting off the silicon wafer. A silicon wafer with a 20 nm thick chemical oxide is brought down into contact with the microcontainer plate with sufficient force (appr. 0.005 $N/cm^2$) to cause a 1% deformation in the thickness of the PDMS microcontainers bringing the liquid in the microcontainers into contact with the silicon substrate. The reaction is allowed to proceed for 30 seconds and the pressure is released from the silicon wafer, which is withdrawn and rinsed with water.

The etched oxide layer provides a patterned mask suitable to allow differential etching of the underlying silicon following exposure to base as described with reference to FIG. 1. The volume of HF used to open the $SiO_2$ protective layer is approximately 100 femtolitre per hole or 0.1 microlitre for a million holes. The patterned oxide layer of the substrate is exposed to an unpatterned hydrophilic stamp made from PDMS with a modulus of $10^5$ $dyne/cm^2$ soaked in 1: 1 isopropanol/(30% KOH water) for 30 minutes. The reaction is allowed to proceed at 70° C. for 1 minute to etch a set of 200 nm deep holes in the silicon in a pattern that matches the pattern of openings in the oxide layer. This "bulk" processing step requires only a few hundred microliters.

As an extension to the above method a microcontainer stamp is formed by curing PDMS with a modulus of $5*10^6$ $dyne/cm^2$ on top of a wafer with silicon protrusions of varying height. Thus the microcontainers in the stamp have different volumes that reflect the height of the protrusions in the master as shown in FIG. 6. A patterned perforated lid is formed and contacted to the microcontainer plate, and rendered hydrophilic as described above. The microcontainers are filled with 10% KOH in water. An unpatterned silicon wafer with its thermal oxide removed by exposure for 1 minute to buffered HF is brought into contact with the microcontainer plate and held with a force of 0.005 $N/cm^2$. The dissolution of the underlying silicon is allowed to proceed until the volume of KOH in the deepest containers is exhausted.

We claim:

1. Method for modifying a surface of a substrate by a reaction, comprising the steps of applying at least one participant in said reaction to a stamp comprising a deformable material;

bringing said stamp into conformal contact with said substrate;

confining the reaction to a lithographic pattern;

filling the at least one participant (44) in the reaction into depressions (453) in a surface of the stamp (45) with the deformable layer (452), said depressions forming said lithographic pattern and filled with different materials (841–843); and bringing said surface of said stamp into conformal contact with said substrate such that said surface of said stamp forms a seal around the openings of said depressions, effectively confining said reaction in accordance with said lithographic pattern.

2. Color printing method in accordance with claim 1, comprising the steps of filling at least two different colors into depressions in a surface (951) of a printing roller (95) with a deformable layer (951), said depressions forming a predefined print pattern; and bringing said printing roller into conformal contact with a printing medium (96), in particular paper, such that said surface of said printing roller forms a seal around the openings of said depressions, effectively confining the color transfer in accordance with said predefined printing pattern.

3. The method of claim 2, characterized in that each color (1040) is filled into separate depressions (1051).

4. The method of claim 2, characterized in that at least two different colors are mixed in a single depression before being transferred to the printing medium (96).

5. The method of claim 1, wherein the participant in the reaction is a catalyst (34).

6. Method in accordance with claim 1, wherein said depressions are filled with different materials (841–843) by using at least one mask (81) covering a part of said depressions.

7. Method in accordance with claim 1, characterized in that a face (553, 554) of the depressions has a higher affinity towards a solution than said surface of said stamp (55).

8. Method in accordance with claim 1, characterized in that said depressions (652; 752) have varying depths and/or cross sections.

9. Method for modifying a surface of a substrate by a reaction, comprising the steps of applying at least one participant in said reaction to a stamp comprising a deformable material, said at least one participant includes a catalyst;

bringing said stamp into conformal contact with said substrate;

confining the reaction to a lithographic pattern;

filling the at least one participant (44) in the reaction into depressions (453) in a surface of the stamp (45) with the deformable layer (452), said depressions forming said lithographic pattern; and bringing said surface of said stamp into conformal contact with said substrate such that said surface of said stamp forms a seal around the openings of said depressions, effectively confining said reaction in accordance with said lithographic pattern.

* * * * *